US007960920B2

(12) United States Patent
Holmes et al.

(10) Patent No.: US 7,960,920 B2
(45) Date of Patent: Jun. 14, 2011

(54) OMNI VOLTAGE DIRECT CURRENT POWER SUPPLY

(76) Inventors: Fred H. Holmes, Van Nuys, CA (US); Kevin C. Baxter, Van Nuys, CA (US); Ken S. Fisher, North Hollywood, CA (US)

( * ) Notice: Subject to any disclaimer, the term of this patent is extended or adjusted under 35 U.S.C. 154(b) by 0 days.

(21) Appl. No.: 12/496,537

(22) Filed: Jul. 1, 2009

(65) Prior Publication Data

US 2010/0060203 A1 Mar. 11, 2010

Related U.S. Application Data

(63) Continuation of application No. 10/708,717, filed on Mar. 19, 2004, now Pat. No. 7,569,996.

(51) Int. Cl.
*H03K 3/42* (2006.01)

(52) U.S. Cl. .......................... 315/291; 315/86; 327/514

(58) Field of Classification Search .............. 363/15–20, 363/89, 95, 97, 132; 323/222, 224, 266, 323/268, 282–285; 315/312, 216, 297, 160, 315/363, 224, 307, 291; 327/108–112; 362/800
See application file for complete search history.

(56) References Cited

U.S. PATENT DOCUMENTS

| | | | | |
|---|---|---|---|---|
| 4,618,812 | A | 10/1986 | Kawakami | |
| 5,598,068 | A | 1/1997 | Shirai | |
| 5,661,645 | A | 8/1997 | Hochstein | |
| 5,739,639 | A | 4/1998 | Johnson | |
| 6,150,802 | A | 11/2000 | Andrews | |
| 6,211,626 | B1 | 4/2001 | Lys et al. | |
| 6,246,184 | B1 | 6/2001 | Salerno | |
| 6,305,818 | B1 | 10/2001 | Lebens et al. | |
| 6,320,330 | B1 | 11/2001 | Haavisto et al. | |
| 6,340,868 | B1 | 1/2002 | Lys et al. | |
| 6,528,954 | B1 | 3/2003 | Lys et al. | |
| 6,556,067 | B2 | 4/2003 | Henry | |
| 6,791,283 | B2 * | 9/2004 | Bowman et al. | 315/291 |
| 6,826,059 | B2 | 11/2004 | Bockle et al. | |
| 6,841,941 | B2 | 1/2005 | Kim et al. | |
| 6,864,641 | B2 | 3/2005 | Dygert | |
| 6,963,175 | B2 | 11/2005 | Archenold et al. | |
| 7,126,387 | B2 | 10/2006 | Nair | |

FOREIGN PATENT DOCUMENTS

GB 2 369 730 A 6/2002

OTHER PUBLICATIONS

Linear Technology, LT1615/LT1615-1, Micropower Step-Up DC/DC Converters in SOT-23, pp. 1-8 (1998).

* cited by examiner

*Primary Examiner* — Rajnikant B Patel
(74) *Attorney, Agent, or Firm* — Irell & Manella LLP

(57) ABSTRACT

A battery operated LED lighting apparatus including: a battery outputting a battery voltage; a light emitting diode or array of light emitting diodes; and a power supply including a boost regulating circuit. The power supply being in communication with the battery and the light emitting diodes such that a constant voltage or constant current is supplied to the light emitting diodes as the battery discharges and the battery voltage falls below the output voltage. In a preferred embodiment the power supply further includes a buck regulator to maintain the proper output voltage when the battery voltage is greater than the output voltage.

10 Claims, 7 Drawing Sheets

OMNI VOLTAGE DIRECT CURRENT POWER SUPPLY

RELATED APPLICATION INFORMATION

This application is a continuation of U.S. application Ser. No. 10/708,717 filed Mar. 19, 2004, now allowed.

BACKGROUND OF INVENTION

The present invention relates to electronic power supplies. More particularly, but not byway of limitation, the present invention relates to a power supply which would provide a pre-determined voltage output from batteries, which themselves could vary in number, voltage or level of charge.

AS will become apparent from the discussion below, there is generally a need for a boost regulator for battery-operated devices whereby the output voltage will remain constant over substantially the entire discharge cycle of the battery. There are several areas where this is especially true such as battery operated lighting used in the motion picture and television industries and for certain battery operated, motorized devices.

U.S. Pat. No. 6,246,184 issued to Salerno represents a step in the right direction. Salerno discloses a boost regulator for a conventional battery operated flashlight wherein, after the battery voltage falls 15-20%, the boost regulator kicks in to provide a substantially constant voltage until a major portion of the stored battery energy has been consumed. While Salerno provides a marked improvement for conventional hand-held flashlights, the improvements are limited to devices where the initial battery voltage is the same as the lamp voltage. In addition, the device of Salerno is clearly drawn to conventional lamps, which employ a filament. Such lamps are inefficient, not daylight balanced, and somewhat fragile compared to alternative lamps.

Continuous arc xenon bulbs (hereinafter referred to as a “xenon lamp”) provide bright, stable, daylight balanced light at power levels from a few watts up to tens of thousands of watts. Such bulbs are widely accepted in architectural, entertainment, and medical applications. Typically, such bulbs require a moderate DC voltage (on the order of 12 to 50 volts) at a relatively high current for steady-state operation. Some longer arc bulbs require higher voltages. Thus, a ballast or power supply is normally required for operation of a xenon bulb. Presently, xenon power supplies may be logically divided into two distinct groups, those that operate on line voltages and those that operate on batteries. The line voltage versions are the larger and more recognizable versions used in motion picture lighting, architectural, and night sky based advertising. The battery versions are usually flashlights of no more than 70 watts. While xenon flashlights do have boosting circuits, they presently do not allow connection to anything other than 12 volt batteries and the output voltage varies with input voltage. These same flashlights operate from 13.2 volts, the fully charged voltage of the 12 volt batteries, down to about 11 volts where the flashlight shuts off. This leaves an enormous untapped potential in the battery.

Car batteries, which are likewise nominally 12 volts, generally have about 1 kilowatt-hour of capacity. If a car battery, through a power supply, were used to power one of the larger fixtures, battery life would be objectionably short. For example, a fixture with a 4 kilowatt xenon bulb could only operate for 15 minutes. This is one reason no large xenon lights are battery powered.

In addition, xenon lamps have a zener diode-like characteristic in that, when a xenon lamp is operating, even small changes in lamp voltage result in disproportionately large changes in current. Accordingly, ballasting is typically employed to limit the electrical current applied to a xenon lamp. Thus there exists a need for a battery operated xenon power supply, which provides ballasting of bulb current and allows a greater portion of a battery’s charge to be extracted before recharging than do present systems.

Light Emitting Diode (“LED”) lamps have traditionally been used for indicators and displays but just recently have evolved into primary illumination sources. This evolution has accompanied the advent of new colors, and brighter LED lamps. Groups of these new and powerful LEDs have recently been integrated into fixtures and have become capable of lighting broad areas with useable levels of light. These devices require a large DC source of power to operate in a non-flickering mode. They are also very sensitive to over-current conditions, which can easily destroy the devices. The voltage required by these LED fixtures depends on the number of individual LEDs that are connected in a series combination inside the fixture. The voltage and current to these fixtures vary with temperature and from device-to-device. Consequently they must be ballasted or regulated to keep a steady output. At present, battery based applications for LED fixtures are primarily for emergency lighting. Initially these fixtures do an adequate job of illuminating, but as the batteries run down, the light intensity fades. This is one primary reason battery based LEDs are not regularly used for illumination in motion picture and photography lighting situations. Photography can’t be precisely practiced with slowly dimming light levels.

There have been a few attempts to run small LED devices on batteries with simple series voltage regulators in-line with the battery. These systems are very inefficient and when the battery discharges even slightly, the circuit begins to dim because there is not enough voltage in the battery to make up for the regulator voltage drop as well as other losses. One could include a larger number of batteries to provide more head room for the regulator, but the higher voltages would cause efficiencies to drop even lower due to increased heating of the regulator. Also the size and weight of the batteries would become unmanageable.

In addition, there are numerous fields in which it is either difficult to match a battery voltage to the requirements of an appliance, or the appliance is intolerant of the diminishing voltage of a draining battery. For example, motion picture and television cameras generally work on rechargeable lead acid or NiCad type batteries. These batteries are used until the voltage drops from an initial 13.2 volts down to between 10 and 11 volts. At that point there is an enormous potential of electricity left but unusable in these batteries. Cameramen typically have multiple sets of batteries used in rotation. Some in use, some being charged, and some waiting as ready. Not only is this number of batteries an expensive proposition, the management of this number of batteries is time consuming, creates logistic nightmares and is otherwise just generally problematic.

Direct current motors are often connected to batteries. This type of configuration is generally used with motors for displays, servos, hydraulic pumps, trolling motors, portable tools, and vehicle-mounted winches. When used with motors, some battery circuits are run through speed control circuits, but otherwise connect directly to the battery. (Trucks and farm machinery have the advantage of constantly recharging their batteries from a running internal combustion engine). Even in this situation, however, the battery voltage can lag during a high cycle use of the motor. And of course, as the voltage goes down, so does the motor speed, and/or torque.

This is clearly evident when using a battery-powered man-lift. As the battery fades, the lift's moving ability becomes less and less until the operator has no choice but to return to the ground, assuming, of course, that there is sufficient power to lower the lift.

Many DC motor driven devices use multiple, series connected batteries to raise the capacity of energy available, while decreasing electrical current through motor, which will extend the usage in both time and torque. The down side of this is that companies often have to make similar and somewhat redundant versions of a particular product line to operate at these different voltages. Added to that, these similar versions may be accidentally confused with one another and consequently connected to incorrect voltages that may destroy the motor or its controller. These multiple-battery configurations also have the added problem of the weakest link. It is well known in the art that the weakest cell may actually reverse charge during normal use, further lowering the voltage available to the motor. As with a single battery, when the collective charge of a series of batteries is discharged to the point where the motor's performance degrades, there is a great deal of energy left in the batteries that can not be tapped by existing techniques.

This problem can also be found in battery-operated tools such as drills, saws, sanders, and the like. Well before the battery charge is fully exhausted, but after the voltage has dropped a few volts, the motors of such devices will not develop enough torque to make the tools usable. As in other areas, spare batteries are often kept on hand so that a set can be charging while a set is in use, and perhaps, a charged set stands ready for use. The investment in batteries can dwarf the investment in the tool itself.

Thus it is an object of the present invention to provide a battery operated electronic power supply, which can provide a constant output voltage over a substantial portion of the battery charge.

It is a further object of the present invention to provide a battery operated electronic power supply, which provides a constant power source for LED based illumination systems over a wide range of battery voltages.

It is still a further object of the present invention to provide a battery operated electronic power supply, which provides a constant power source for DC motors.

It is yet a further object of the present invention to provide a battery operated electronic power supply, which provides a ballasted, constant power source for operating a xenon light.

SUMMARY OF INVENTION

The present invention provides an electronic power supply, which provides a predetermined, steady state voltage to a battery-operated appliance, such as a light or motor. The power supply, powered by a variable number of batteries connected in series, will provide a constant output voltage, regardless of the number of batteries or the condition of their charge, until substantially all of the battery charge has been depleted.

In one preferred embodiment, a ballasting DC-DC converter includes: a boost regulator for providing a predetermined voltage; and a ballasting circuit for providing efficient, precise control of a bulb current in a xenon fixture. Those familiar with xenon lamps will appreciate that the operation of such bulbs requires a number of steps. First, with an unstruck lamp, a starting voltage must be applied across the contacts of the lamp, typically at least three or four times the operating voltage. Next an igniter pulse of several thousand volts must be momentarily applied to the lamp to start the arc. Finally, the voltage and current must be managed to operate the lamp in its steady state condition. These steps are performed within the inventive battery operated power supply.

In another preferred embodiment, the ballasting DC-DC converter is used to drive an array of light emitting diode, or light emitting crystal, lamps. Preferably, the array consists of the parallel combination of series-wired groups of lamps. The output voltage of the DC-DC converter is selected to be slightly higher than the combined operating voltage of the series combination of lamps. Each series combination is then configured with a ballasting device; preferably a resistor, to ensure the current flowing through each series combination is roughly equivalent to that of the other groups of lamps.

The current flowing through the entire array may be controlled by a MOSFET, or other solid-state switch, such that the brightness of the array can be controlled. Alternatively, the DC-DC converter may be operated in a constant current mode such that a desired electrical current is driven through each series combination of LED lamps. The brightness can be controlled by setting the total current produced by the power supply while operating the lamps in a true flicker-free fashion.

In another preferred embodiment, each series wired group of LED lamps is ballasted with an inductor. The brightness can then be controlled by varying the frequency at which the MOSFET is operated, thus varying the effective impedance of the inductor.

In another preferred embodiment, a two-pin constant current regulator is provided for ballasting an LED lamp, or a series combination of LED lamps. Preferably the device would be manufactured to pass a particular current as required for operation of the lamps. A number of problems associated with the practice of using resistors to ballast LED lamps are overcome by the inventive current regulator.

In yet another preferred embodiment, the inventive DC-DC converter provides a regulated output higher than the expected battery voltage. It is well known in the art that to achieve a particular torque from a DC motor, there is an inverse relationship between voltage and current. By providing a substantial increase in the operating voltage of the motor, the motor can employ smaller wire, experience reduced brush wear, etc. In addition, the inventive power supply is configured to output a tightly regulated voltage over a broad range of input voltages. Unlike directly powering the motor from a battery, or group of batteries, when driven from the inventive device, the motor will operate with consistent performance until the battery is essentially completely discharged.

In still another preferred embodiment there is provided a battery including an integral boost or boost/buck regulator such that, regardless of the application the battery is used in, the voltage provided by the battery is substantially constant until the battery itself is discharged to a predetermined voltage.

Further objects, features, and advantages of the present invention will be apparent to those skilled in the art upon examining the accompanying drawings and upon reading the following description of the preferred embodiments.

DETAILED DESCRIPTION

Before explaining the present invention in detail, it is important to understand that the invention is not limited in its application to the details of the construction illustrated and the steps described herein. The invention is capable of other embodiments and of being practiced or carried out in a variety of ways. It is to be understood that the phraseology and terminology employed herein is for the purpose of description and not of limitation.

Figure 1:
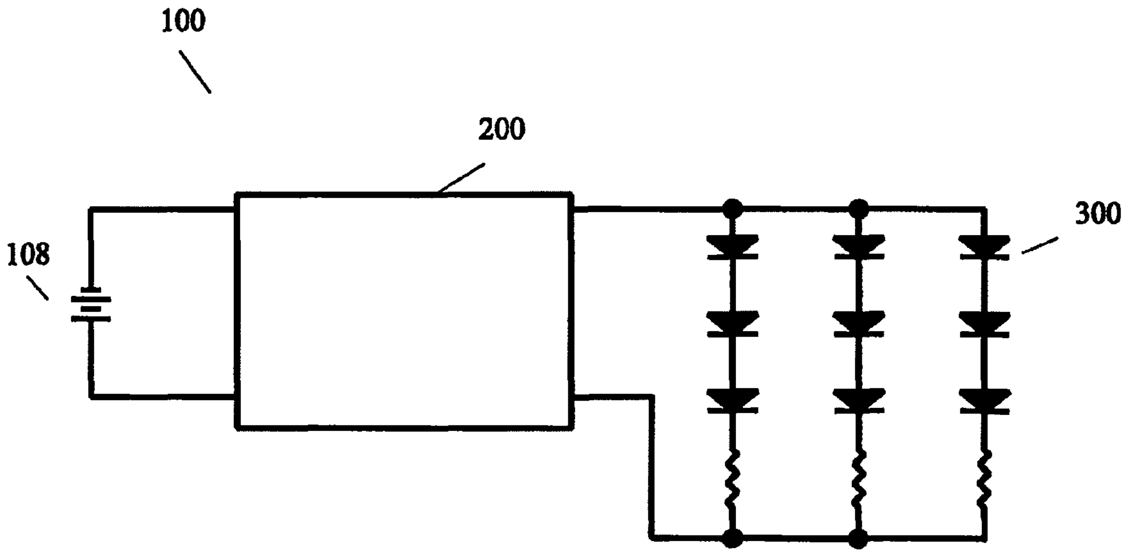
FIG. 1 provides a block diagram of a battery operated lighting system having the inventive power supply.

Referring now to the drawings, wherein like reference numerals indicate the same parts throughout the several views, a typical ballasting DC-DC converter for power LED lamps is shown in FIG. 1. Preferably, converter 100 comprises boost regulator 200 for powering and ballasting lamp array 300. Generally, converter 100 is powered by a battery, i.e., battery 108, but may also be powered by a power supply, for example a wall plug-in type supply.

Figure 2:
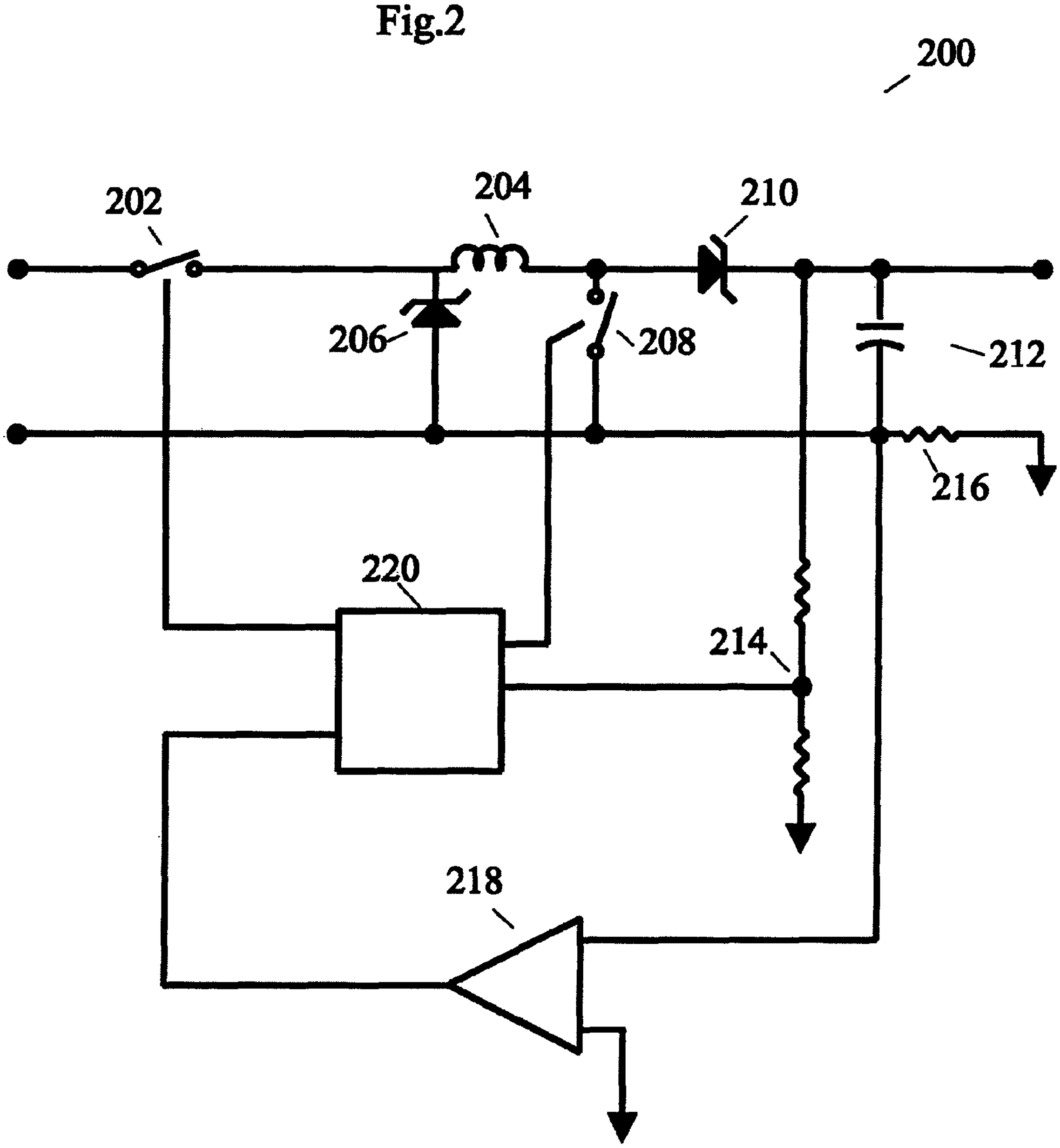
FIG. 2 provides a block diagram for a preferred embodiment of a boost/buck circuit employed in inventive power supply.

Referring to FIG. 2, boost/buck regulator 200 comprises: an inductor 204; a switching circuit 220 for controlling the current flowing through inductor 204; a first Schottky diode 206 which controls the flow of current upon the opening of bucking switch 202; a second Schottky diode 210 which controls the flow of current upon the opening of boosting switch 208; a capacitor 212 for filtering the output of regulator 200; a voltage divider 214 which sets the output voltage of regulator 200; and current sense resistor 216 and amplifier 218 which provide feedback to circuit 220 of output current. Switching circuit 220 could be constructed from an integrated switching regulator, discrete components, or a combination of discrete components and integrated circuits. In a preferred embodiment, controller 220 comprises a microcontroller such as the PIC16F819, manufactured by Microchip Technology, Inc. of Chandler, Ariz., and programmed to monitor the output voltage and current while operating switches 202 and 208 to maintain proper conditions at the output. When additional charge is needed at capacitor 212, switch 202 is operated at progressively higher duty cycles. When switch 202 approaches 100 per cent duty cycle, circuit 220 begins operating switch 208 to boost the voltage at capacitor 212 to a voltage higher than is available at switch 202.

Figure 3:
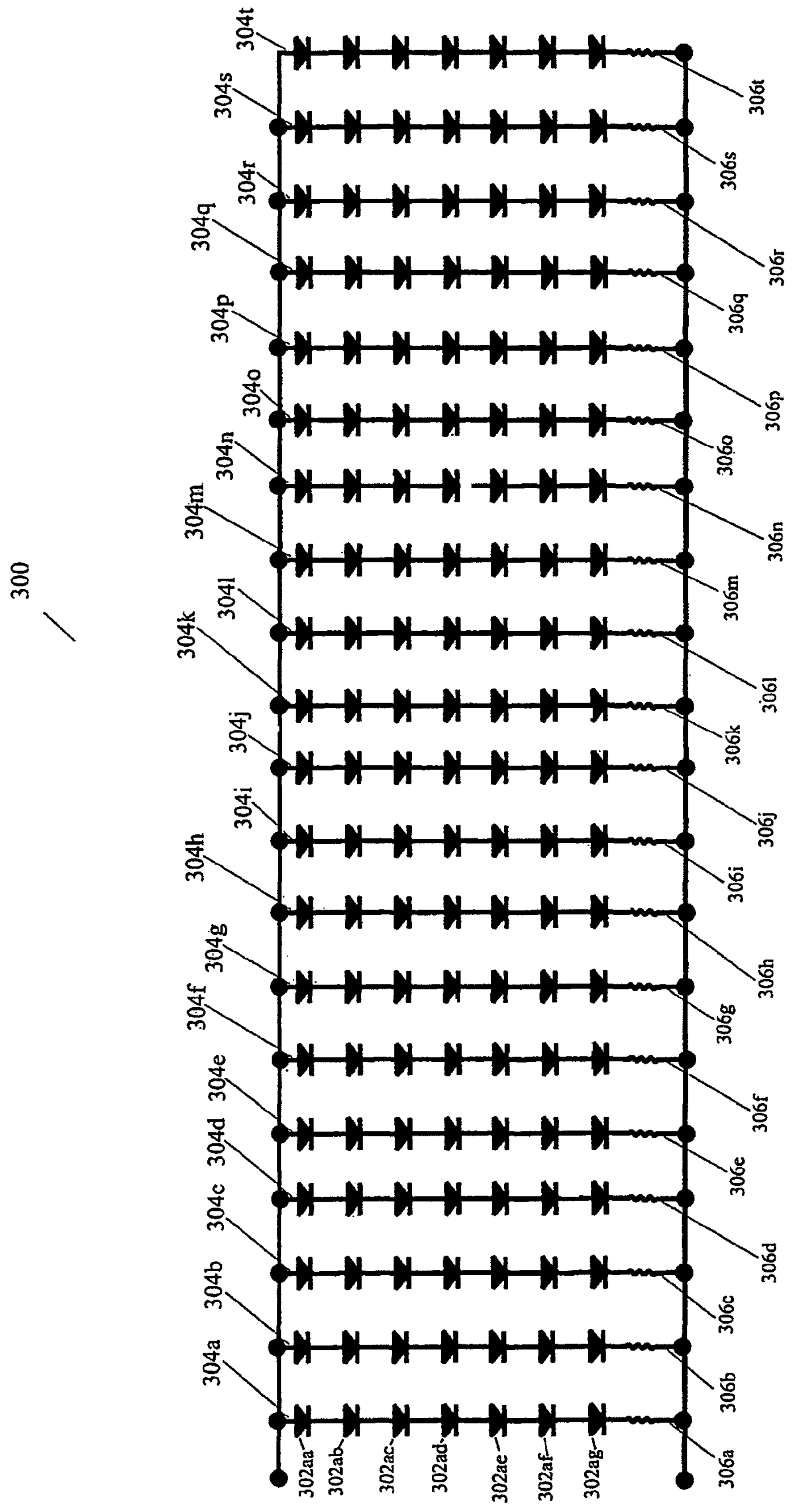
FIG. 3 provides a schematic diagram for an array of LED lamps which are configured for use with the inventive power supply.

Turning next to FIG. 3, LED array 300 comprises a plurality of light emitting diodes, of which LED lamps 302*aa-ag* are typical, configured as a parallel arrangement of series combinations of light emitting diodes. In a typical configuration, a lighting device might consist of 20 columns 304*a-t* of LED lamps wired in parallel, each column consisting of, for example seven lamps, e.g., 302*aa-ag,* wired in series. As will be apparent to those skilled in the art, the series arrangement of lamps in a column ensures that each lamp of a column will have the same electrical current flowing through it as the other lamps of that column. In addition, each column includes ballasting resister 306*a-t* to reduce the effects of slight voltage variations from LED-to-LED and insure the electrical current will be properly shared between individual columns. Such ballasting improves the consistency of brightness between individual LED lamps. As will appreciated by those skilled in the art, for a particular intensity, the LED lamps of the present invention operate at a substantially constant voltage and substantially constant current, unlike LED lamps driven by tradition pulse width modulation schemes. When used for motion picture or television filming, driving the LED lamps with a constant DC power ensures that beating between the filming frame rate and the LED modulation will never cause flicker, unlike pulse width modulation schemes.

Referring to FIGS. 1-3, in operation, the output of battery 108 is applied to boost/buck regulator 200. Preferably, regulator 200 provides an output voltage which can greater than the battery voltage, less than the battery voltage, or the same as the battery voltage. The output voltage of regulator 200, which is also the input voltage to array 300, will remain constant regardless of the voltage of battery 108, at least within reason. As the output of regulator 200 is applied to LED array 300, resistors 306*a-t* provide ballasting of the current flowing through each series arrangement of LED lamps.

By way of example and not limitation, in one preferred embodiment, the voltage across each LED lamp is approximately 2.7 volts, at 20 milliamps of LED current, and the current flowing through each LED is controlled over a range from about zero milliamps through about 20 milliamps. The total current consumed by the array is measured through current sense resistor 216 and sense amplifier 218. In a preferred embodiment controller 220 maintains a constant adjustable current flowing through resistor 216, so long as the voltage at 214 does not exceed a predetermined maximum value, the value being roughly equal to the operating voltage of an LED at maximum current times the number of LED lamps in each series combination. Thus, for example, assuming 20 milliamps per series combination and 20 combinations at full brightness the current would be controlled at 400 milliamps. To dim the LED's the current is simply maintained at some value between zero and 400 milliamps. Traditional dimming of LED's is typically performed by pulse width modulation. Unfortunately in motion picture applications beating between the PWM frequency and the frame rate can result in undesirable perceivable flicker in the resulting images, which was not perceivable to the naked eye.

It should be noted that as the battery voltage begins to sag from discharge, preferably regulator 200 compensates to maintain the proper output voltage, and thus maintain constant brightness of the lamps, at least to down to battery voltages approaching about 3 volts DC. Accordingly, the inventive circuit allows virtually all of the charge to be extracted from the battery 108 as opposed to conventional techniques wherein any drop in battery voltage produces a corresponding reduction in brightness.

Figure 6:
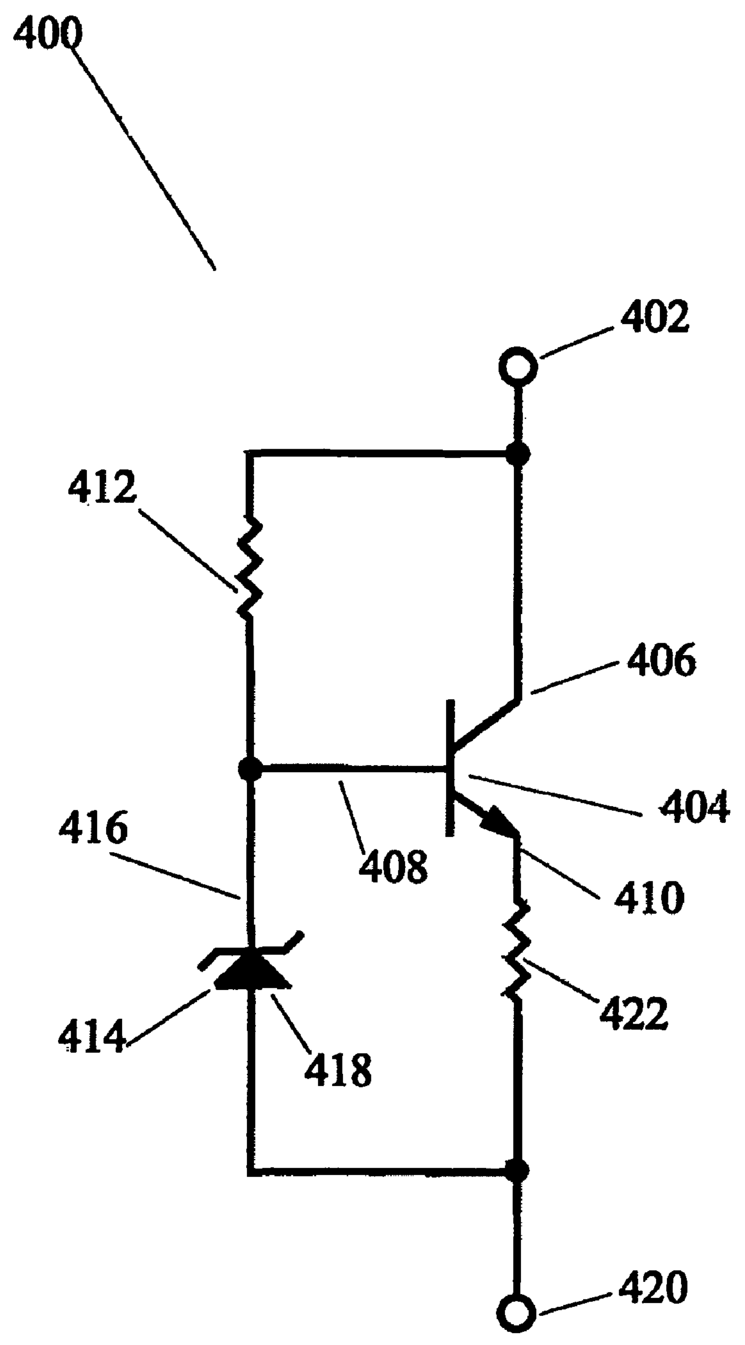
FIG. 6 provides a schematic diagram for a two-pin current-regulating device.

Turning now to FIG. 6, as is well known in the art, parallel combinations of LED lamps do not inherently load share well. Typically the lamp, or string of lamps, with the lowest forward voltage will hog the current provided for the entire array of lamps resulting in a group of LED lamps with varying brightness throughout the group. This problem can be alleviated, at least to some degree by providing the LED array with a voltage greater than the required forward voltage for the grouping, and providing a ballasting device in series with each series combination of LED lamps. Traditionally a resistor has been employed for this purpose. Unfortunately, resistors consume energy and therefore reduce the efficiency of the system. In one preferred embodiment discussed above, a reactive element, i.e. an inductor was employed to ballast each string of lamps because the inductor is a storage element, which returns the energy to the system thereby improving the efficiency of the system. Unfortunately, neither ballasting technique completely solves the problem with load sharing and individual LED lamps in the array may appear brighter, or dimmer, than their neighboring devices.

Ideally, a constant current source would be employed for each series combination of LED lamps. While this technique would ensure equal current flows in each series combination, unfortunately it would also consume a great deal of board space and substantially raise the cost of the board. However, a constant current ballasting circuit 400 could be used to ensure the proper current flows through each string of lamps. Circuit 400 could be reduced to a two terminal device, i.e. terminals 402 and 420, which is simply wired in series with a string of resistors to provide a variable voltage drop to control the current flowing therethrough at a predetermined level. Thus the same constant current of a predetermined value will flow through every LED in an array, even if some series-wired groups have more, or less, LED lamps than others within the array. As will be appreciated by those skilled in the art, circuit 400 could easily be housed in an industry standard 1206 surface mount package and consume only minimal board space.

Circuit 400 comprises a positive first terminal 402 providing external access to the collector 406 of transistor 404 and resistor 412. The opposite end of resistor 412 is connected to the base 405 of transistor 404. The cathode 416 of Zener diode 414 is also connected to base 408 and the anode 418 is connected to negative terminal 420. Resistor 422 connects the emitter 410 of transistor 404 to negative terminal 420. When placed in circuit, electrical current flows through resistor 412 and zener diode 414 such that the voltage at base 408 will be the same as the reverse zener voltage of diode 414. As will be apparent to those skilled in the art, the voltage at emitter 410 will be the voltage at base 408 minus the voltage drop between base 408 and emitter 410 which is a relative constant value, typically about 0.65 volts. The voltage across resistor 422 is thus a constant equal to the zener voltage minus 0.65 volts. Thus it can be seen that the current flowing through transistor 404 must be defined by the equation:

$$I_{CE}=(V_z-0.65)/R_E$$

where:

$I_{CE}$ is the current flowing from the collector to the emitter of transistor 404;

$V_z$ is the zener voltage of diode 412; and $R_E$ is the resistance of resistor 422.

Thus, circuit 400 could be integrated into a single package having two terminals for connection to other circuitry. As will be appreciated by those skilled in the art, the inventive ballasting circuit will perform in an identical manner whether: the negative terminal 420 is connected to ground with positive terminal 402 connected to the cathode of a string of LED lamps; the positive terminal 402 is connected to the positive voltage supply and terminal 404 is connected to the anode of a string of LED lamps; or even if circuit 400 is simply inserted between a pair of lamps in a series combination of LED lamps.

While circuit 400 will experience heat producing losses, like its fixed resistance counterpart, it provides the distinct advantage over both the resistive and reactive ballasting techniques in that it forces correct load sharing among the LED lamps of an array, regardless of the forward voltage of individual lamps.

As will be appreciated by those skilled in the art, it can be seen that the inventive power supply is also well suited for use with xenon lamps. Like the LED lamps of the previous embodiment, a characteristic of xenon lamps is that a small change in voltage results in a comparatively large change in current, hence the need to provide ballasting. Changes which would tailor the inventive power supply to a xenon lamp would include: configuring the regulator 200 to produce a starting voltage of approximately 150 volts prior to igniting the lamp, as will be appreciated by those skilled in the art, virtually no current is required at this voltage since the lamp has not been struck; and providing an igniter circuit of the type presently in use with xenon bulbs. In other respects, the circuit would function in an identical manner in that a boost/buck circuit would precondition incoming battery power such that a constant output voltage, or a constant output current, could be produced over a range of input voltage from about three volts to about forty volts. Dimming of the lamp can be effected by varying the frequency of the pulse width modulator, adjusting the duty cycle of the output of the pulse width modulator, controlling the output current of regulator 200, or some combination of these techniques. It should be noted that, unlike the LED lamps, dimming of a xenon lamp is typically only practical over a range of approximately one f-stop (e.g., 100% down to 50%). To insure proper ballasting, and proper dimming, the range of the duty cycles produced by the pulse width modulator could be limited, byway of example and not limitation, to between 35% and 70%, assuming of course, that dimming was accomplished through pulse width modulation rather than by varying the output current.

Figure 4:
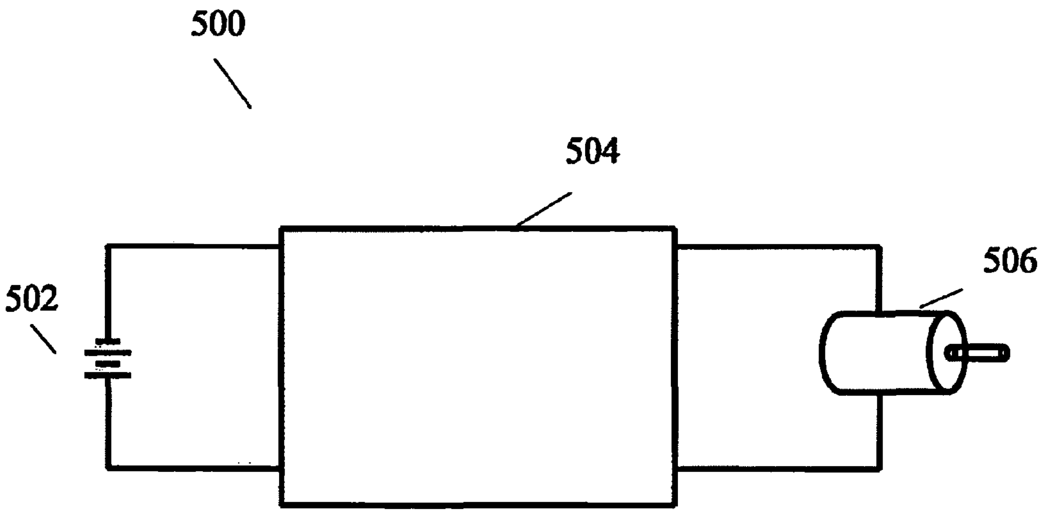
FIG. 4 provides a block diagram for a motorized appliance using the inventive power supply.

Referring next to FIG. 4, wherein is shown the inventive power supply 500 operating in combination with a battery 502 and a motor 506. Those familiar with battery operated motorized devices will readily appreciate the advantages of using the inventive power supply circuit as a power source for a DC motor, the primary advantages being constant motor speed over a wide range of input voltages and the ability to extract virtually all of the stored energy from a battery. As mentioned above, motion picture and television camcorders are particularly prone to unacceptable speed variations due to changes in battery voltage. The types of these devices used for commercial purposes often have separate battery packs, or sometimes belt batteries worn by the cameraman. Invariably, while internally these cameras usually have a servo drive, which provides consistent operation over some range of voltages, these devices seldom perform well when battery voltage drops below about 75% of the full charge voltage. In the entertainment industry, battery management is a major ordeal. While ballasting is not required for motor applications, by including the inventive boost regulator 500 between the battery and the camera, a camera may be operated without degradation from batteries having a full charge down to approximately three volts. This added range over which the batteries may operate will reduce the need for spare batteries, reduce the number of battery changes and, perhaps most importantly, will reduce the occurrence of problems related to low voltage when filming.

Another example of a motorized application for which the present invention is particularly well suited is a battery operated electric winch. As will be appreciated by those familiar with such devices, as the battery discharges, the ability of winch to lift degrades. This leads to a number of problems, some of which can actually be dangerous, for example leaving a large heavy object overhead. When driven by the inventive power supply, performance of the winch remains constant over virtually the entire discharge cycle of the battery.

Yet another example of a battery operated motorized device is a trolling motor for a fishing boat. Like other motorized devices, the performance of the trolling motor degrades as the battery discharges. As a result, a fisherman will typically replace the battery while substantial charge remains in the battery because the performance of the motor deteriorates below a reasonable level. With the present invention, virtually the entire charge can be extracted from the battery while motor performance remains constant.

Yet another advantage to using the inventive power supply with a trolling motor arises with higher voltage motors. Trolling motors are often available for use at higher voltages, typically a multiple of 12 volts (that of a conventional car battery), i.e., 24, 36, or 48 volts. The advantage being that, for a particular horsepower, thinner wires can be used reducing the size and weight of the motor. A fisherman with a higher voltage motor then wires multiple batteries in series to produce the needed voltage. In such a system, the battery voltage will fall at a rate determined by the weakest battery, if one battery goes dead; the fisherman has to troubleshoot to locate the dead battery.

In contrast, a fisherman could employ the inventive power supply adjusted to produce, for example, 48 volts to obtain the highest performing trolling motor. Batteries could either be used one-at-a-time or in a series combination. If batteries are used individually, the system will continue to provide consistent performance from the motor until the battery voltage approaches three volts, far below the present usable level. When a battery goes dead, it is simply replaced by one of the other batteries, which would have been wired in series under previous schemes. Thus the fisherman can extract the maximum charge from the combination of batteries.

Alternatively, the fisherman could again wire the batteries in series to produce 48 volts with fresh batteries. As the series combination discharges, the motor will continue to function normally until the series combination of the four batteries reaches approximately three volts. At that time, the fisherman could even measure each battery and extract the remaining power from any battery having charge left (assuming that the further discharged batteries were loading the output of the combination and reducing the output voltage instead of contributing). In this scheme, the fisherman would not spend as much time on the water changing batteries.

Figure 5:
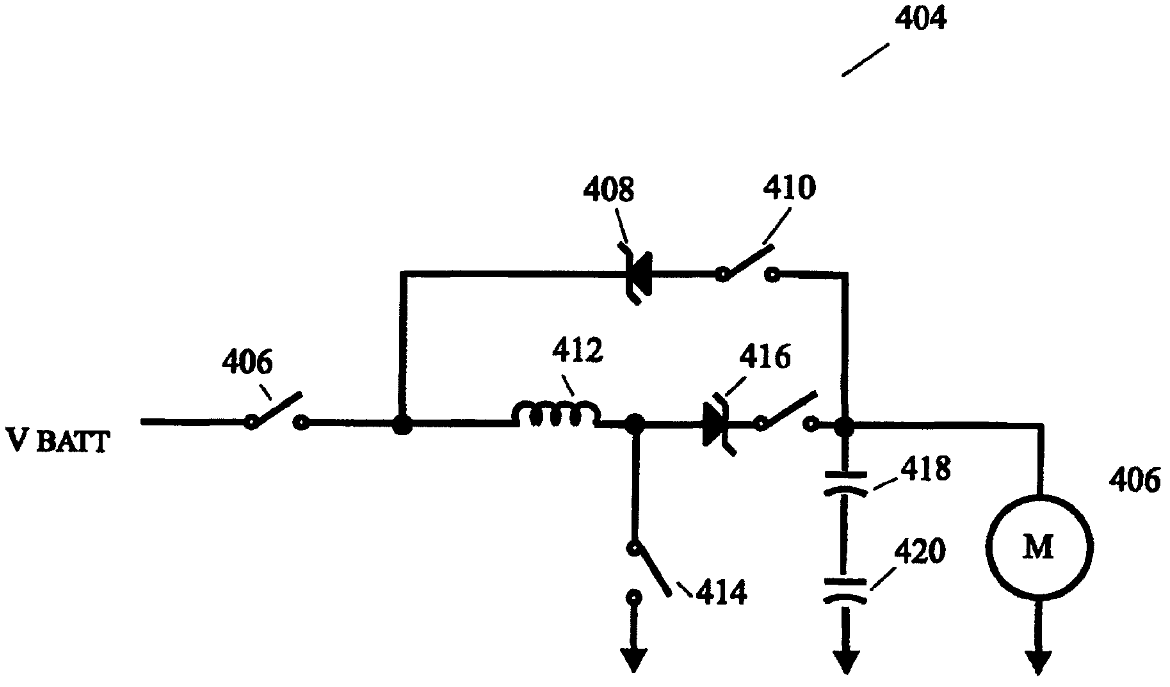
FIG. 5 provides a block diagram for a preferred embodiment of the inventive power supply which provides a reversing voltage for a DC motor.

Another advantage to using the inventive power supply with trolling motors, as well as other motorized devices, is the ease with which reversing can be accomplished. As will be appreciated by those skilled in the art, traditionally reversing has been accomplished either by driving the motor with an H-bridge or by employing a reversing relay, yet such components are prone to failure, causing much frustration to end-users and system designers. The present invention provides an attractive alternative to either of the prior art solutions in that the inventive power supply can be configured to selectively produce either a positive or negative voltage. Turning to FIG. 5, with switches 410 and 414 open, and switch 416 closed, switch 406 can be modulated to control the current in inductor 412 and thereby provide buck regulation such that a positive voltage less than or equal to the battery voltage is presented at motor 406. With switches 406 and 416 closed and switch 410 open, switch 414 can be modulated to control the current through inductor 412 and thereby provide boost regulation such that a positive voltage greater than the battery voltage is presented at motor 406. With switches 410 and 414 closed and switch 416 open, switch 406 can be modulated to control the current through inductor 412 and thereby provide negative regulation such that a negative voltage is presented at motor 406 to reverse the direction of rotation of motor 406. Capacitors 418 and 420 filter the output to remove ripple from the output voltage. If polarized capacitors are used, capacitor 418 is reversed in direction from capacitor 420 so that one capacitor is properly polarized for positive regulation and the other capacitor is properly polarized for negative regulation.

By way of example and not limitations, other areas, which could benefit from the inventive power supply include: battery operated emergency or construction road signs; emergency lighting systems for buildings; battery operated tools, and other such systems. It should be noted that boost type regulators typically operate with efficiency in the range of 85% to 95%. The additional energy recovered from a battery and the advantage that the system operates at full performance over the entire discharge cycle far outweigh losses due to inefficiency.

Figure 7:
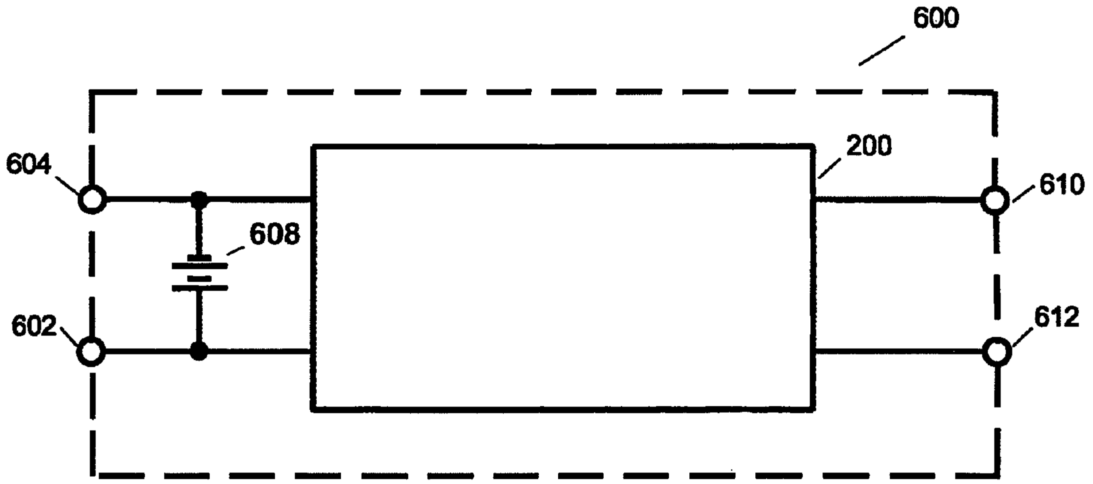
FIG. 7 provides a block diagram of a battery having an internal regulator to provide a constant voltage throughout the discharge cycle of the battery.

Finally, with reference to FIG. 7, the inventive power supply 200 is exceptionally well suited for incorporation directly into a rechargeable battery 600, regardless of the application. When incorporated in battery 600, as the charge is drawn from cell 608, regardless of its chemistry, and its output experiences a corresponding drop in voltage, boost regulator 200 will act to regulate the voltage at positive terminal 610 to hold the voltage at a substantially constant level relative to negative output 612 until cell 608 has been discharged to a predetermined level. It should be noted that the level of discharge at which the output of regulator 200 shuts off can be selected to ensure maximum battery life is obtained. For example, it is generally held that nickel cadmium batteries will achieve maximum life when the battery is regularly completely discharged. Accordingly, boost regulator 200 can be configured to operate until cell 608 is virtually exhausted. It is generally held; on the other hand, that lead acid batteries achieve maximum life is not entirely discharged. Accordingly, when used with a lead acid battery, boost regulator 200 can be configured to shut off output 610 when about 75% of the battery's capacity has been used. Of course the above examples are provided by way of example and not limitation and the inventive power supply can be integrated into the housing of batteries of virtually any chemistry.

Recharging can be accomplished by connecting a recharging voltage across terminals 602 and 604.

It should also be noted that, while a three-volt dropout has been discussed with regard to the preferred embodiment, the invention is not so limited. Depending on the specific design of the boost regulator, there will always be some non-zero dropout voltage.

Thus, the present invention is well adapted to carry out the objects and attain the ends and advantages mentioned above as well as those inherent therein.

While presently preferred embodiments have been described for purposes of this disclosure, numerous changes and modifications will be apparent to those skilled in the art. Such changes and modifications are encompassed within the spirit of this invention.

The invention claimed is:

1. A battery operated LED lighting apparatus comprising:

one or more connectors or terminals for receiving a battery voltage output by a battery;

at least one light emitting diode;

a power supply including a boost regulating circuit, said power supply in communication with said battery to produce an output voltage to said at least one light emitting diode such that a constant direct current is continuously supplied at a predetermined level to said at least one light emitting diode as said battery discharges regardless of voltage fluctuations across said at least one light emitting diode, wherein over said discharge cycle said output voltage is maintained in a range higher than said battery voltage, and wherein the power supply maintains the constant direct current by sensing electrical current directed through the at least one LED; and a voltage sensor for monitoring a voltage across the at least one LED, wherein the boost regulating circuit uses the monitored voltage to maintain the voltage range for the output voltage to said at least one LED.

2. The battery operated LED lighting apparatus of claim 1, wherein said at least one light emitting diode comprises a plurality of groups each having a plurality of light emitting diodes, said groups being connected in parallel, and the light emitting diodes within each group being connected in series.

3. The battery operated LED lighting apparatus of claim 2, wherein each group has the same number of light-emitting diodes.

4. The battery operated LED lighting apparatus of claim 3, wherein said each group further includes a ballasting element connected in series with said plurality of the series-connected light emitting diodes.

5. The battery operated LED lighting apparatus of claim 4, wherein each ballasting element has a value such that the level of direct current drawn by each group is substantially identical.

6. The battery operated LED lighting apparatus of claim 4 wherein said ballasting element comprises a resistor.

7. The battery operated LED lighting device of claim 1, wherein said boost regulating circuit is operated in a switched mode.

8. The LED lighting apparatus of claim 7, further comprising a microcontroller operable to monitor the output voltage and constant direct current, and to operate switches of said boost regulating circuit to maintain the output voltage within said range.

9. The LED lighting apparatus of claim 1, wherein said constant direct current is adjustable to effectuate dimming of said at least one light-emitting diode.

10. The LED lighting apparatus of claim 1, wherein the constant direct current supplied to said at least one light emitting diode is measured through a current sense resistor and a sense amplifier.

* * * * *